United States Patent [19]

Geffon

[11] 4,165,491

[45] Aug. 21, 1979

[54] CIRCUIT FOR DETECTING ZERO CROSSING POINTS FOR DATA SIGNAL

[75] Inventor: Arthur P. Geffon, Sunnyvale, Calif.

[73] Assignee: Sperry Rand Corporation, New York, N.Y.

[21] Appl. No.: 885,654

[22] Filed: Mar. 13, 1978

Related U.S. Application Data

[63] Continuation of Ser. No. 739,832, Nov. 8, 1976, abandoned.

[51] Int. Cl.$^2$ ............................................. H03K 5/153
[52] U.S. Cl. ................................... 328/150; 307/354; 307/362

[58] Field of Search ............... 307/234, 354, 360, 362; 328/111, 116, 117, 150, 151

[56] References Cited

U.S. PATENT DOCUMENTS

| 3,505,537 | 4/1970 | Giordano | 307/362 |
| 3,727,079 | 4/1973 | Garrett | 307/354 |

Primary Examiner—John Zazworsky
Attorney, Agent, or Firm—Gerald L. Moore

[57] ABSTRACT

A circuit for accurately detecting the zero crossing points of a data signal. Noise in the signal is eliminated by deleting all noise present on the signal having an amplitude or a width less than a predetermined value prior to detecting the crossover points.

4 Claims, 5 Drawing Figures

CIRCUIT FOR DETECTING ZERO CROSSING POINTS FOR DATA SIGNAL

This is a continuation of application Ser. No. 739,832, filed Nov. 8, 1976 now abandoned.

BACKGROUND OF THE INVENTION

In present data systems recorded data is being compressed into smaller areas thereby increasing the need for accuracy in detecting the signal and generating clocking signals. Also in later data codes the signal can run longer without having zero crossing points. This fact makes not only the accurate detection of the zero points a much greater necessity but also allows for more errors in data, in terms of extra zero crossings, in the reading of the data when the detection of the zero crossing points are erroneous due to noise.

In the past there have been attempts to delete noise from data signals by differentiating between noise and data on the basis that the data pulses have a greater amplitude. However the noise pulses frequently can be of an amplitude equal to that of the data making such detection erroneous. In addition the amplitude of the data pulses can vary significantly because of other conditions such as head flying height, the strength of the signal recorded, coding et cetera, such that such a system which normally could detect the zero crossings of the data accurately may frequently detect false data pulses because of the noise in the data signal. Thus the amplitude detection for deleting noise from data or other communications signals is not totally effective.

It is the primary object of this invention to provide an improved circuit for accurately detecting zero crossover points of a data signal by effectively deleting the noise from the signal prior to such detection.

SUMMARY OF THE INVENTION

A circuit for detecting zero crossing points of data in a communications signal comprising a first circuit for generating a pulse responsive to each zero crossover point of the signal and a second circuit for generating pulses only when the signal pulses exceed a predetermined amplitude threshold and have a pulse width exceeding a predetermined magnitude, and means to signal a data crossover point only when pulses from the first and second circuits occur simultaneously.

DESCRIPTION OF THE INVENTION

Figure 1:
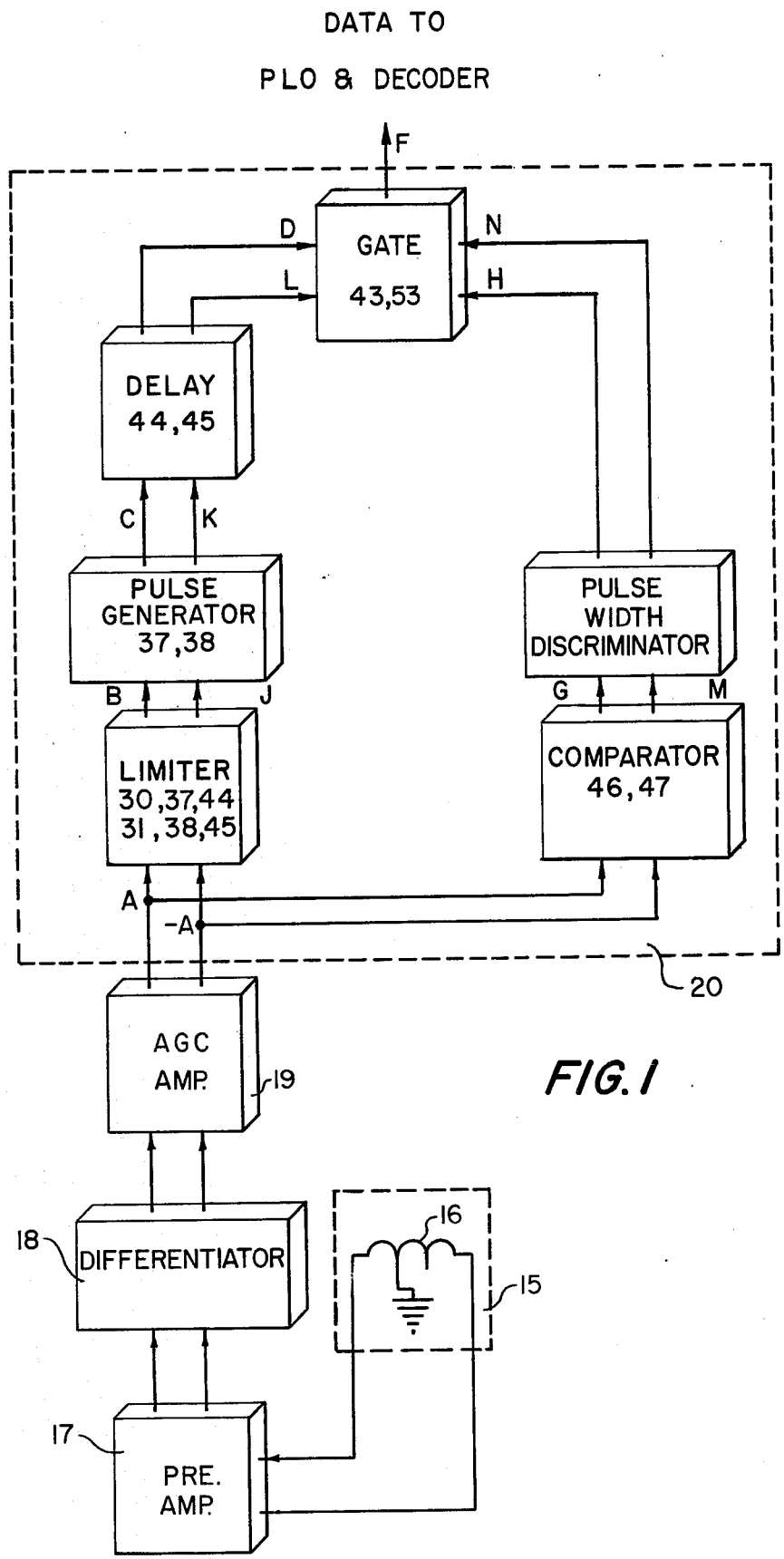
FIG. 1 is a block diagram of a data detection system of the type in which the subject invention can be used.

In FIG. 1 is shown a block diagram of a typical data detection system in which the subject invention can be incorporated. The data is detected from a recording medium (not shown) by a readback head 15 having a coil 16 with a center tap connected to ground. The data signal and the inverted data signal are detected and amplified in a preamp. 17, differentiated in a differentiator 18 and amplified in the amplifier 19. Thereafter the data is passed through a zero crossover detector 20 for detecting the zero crossover points and the deletion of noise. The subject invention is incorporated in the zero crossover detector 20.

Figure 3:
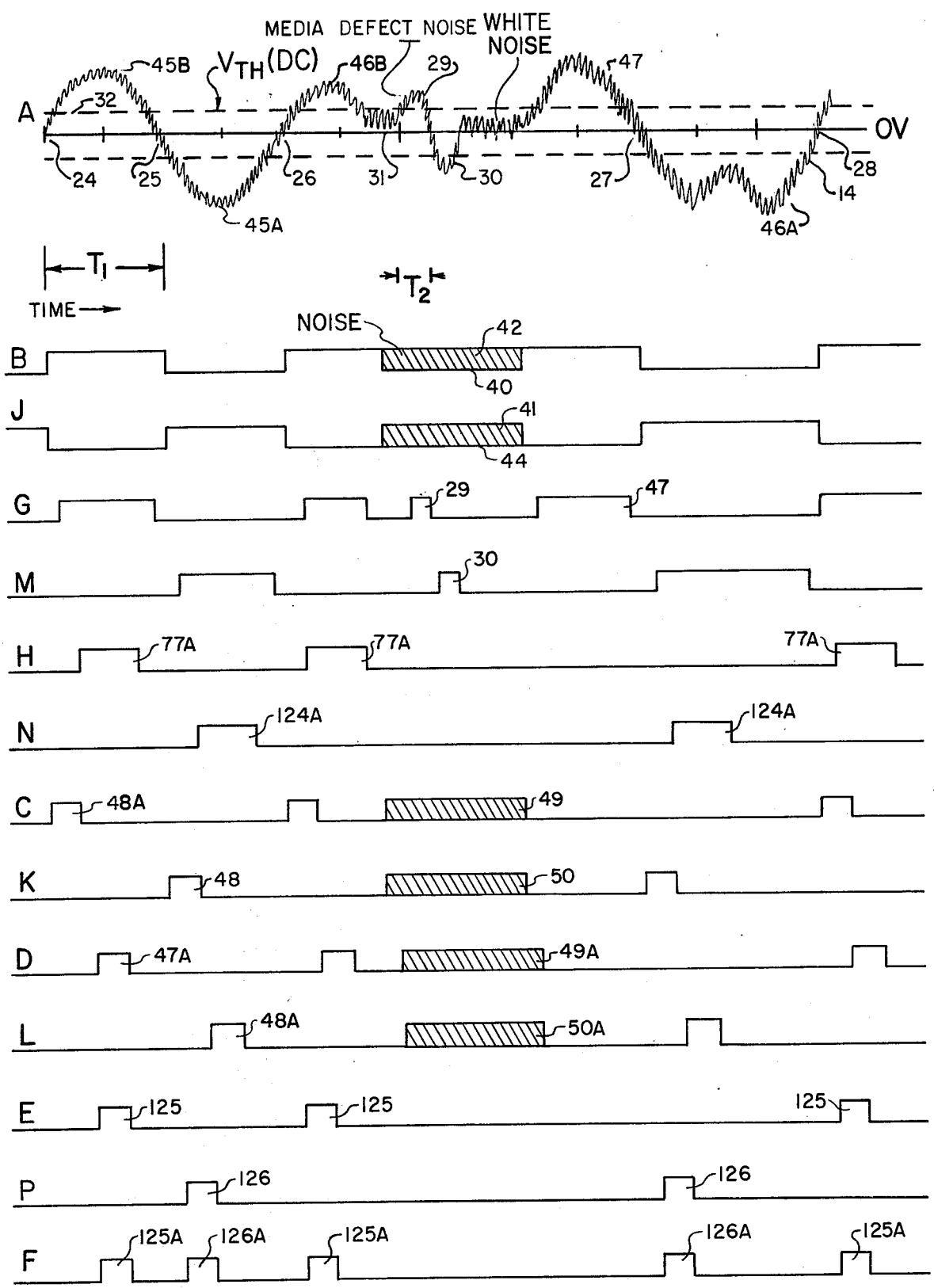
FIG. 3 shows the data input signal and various waveforms generated within the circuit of FIG. 2.

In FIG. 3 is shown a typical data pulse with additive noise signal A and wherein the data zero crossings 24, 25, 26, 27 and 28 are to be detected. For reading the data and generating synchronized clocking pulses, these zero crossing points must be detected accurately. These zero crossover points occur between the data pulses 45B, 45A, 46B and 46A. However there frequently exists noise pulses such as the pulses 29 and 30 with white noise pulses 31 interspersed with the data pulses. These pulses can be caused by anomalies in the recording media or by other interference present in the data readback system. As can be seen, any attempt to eliminate such pulses by setting a threshold voltage such as the threshold level 32 identified as $V_{TH}$ would not be totally effective since the pulses 29 and 30 exceed in magnitude any threshold voltage that is sufficiently low as not to also eliminate data pulses. While elimination of some noise in the signal is achieved, not all noise will be deleted. Thus if the signal A is fed into the data system, an erroneous reading of the data can result because of the presence of noise pulses not detected and eliminated. However if the threshold voltage is set higher, data dropout may be experienced.

Each zero crossing of data (24, 25, 26, 27) is succeeded by a peak in readback data signal (45B, 45A, 46B, 46A). The pulse 47 is an extraneous data pulse in that it is necessary for the formation of the data stream but gives no new information that can be used in the zero crossing detection. In that sense it can be considered a noise pulse and it too must be eliminated from the data stream. This is accomplished by the toggle action that will be described later.

One phenomena in such data systems has become recognized in the present invention which represents a further characteristic of noise pulses differing from that of data pulses. Normally the data in a typical communication signal has a minimum pulse width $T_1$ (FIG. 3) of approximately 100 nanoseconds. In contrast, noise encountered in such systems normally has a pulse width $T_2$ which is considerably less, normally no greater than 50 nanoseconds. In accordance with the present invention, there is provided the circuit of FIG. 2 for detecting the zero crossover points of the data signal by using this characteristic of noise pulses. This circuit includes circuits X and Y for receiving the data signal A and the data signal -A respectively. The signal -A is generated in the other half of the readback head coil 16. Individually these circuits generate a first signal from which has been deleted the noise pulses which have an amplitude below a preselected threshold voltage and a pulse width less than a predetermined value. Simultaneously each circuit generates pulses responsive to the data zero crossover points alternately for the portions of the data signal having a positive going slope and a negative going slope respectively, which pulses are gated together to represent a true data crossover point signal in synchronism with the original data signal.

Figure 2:
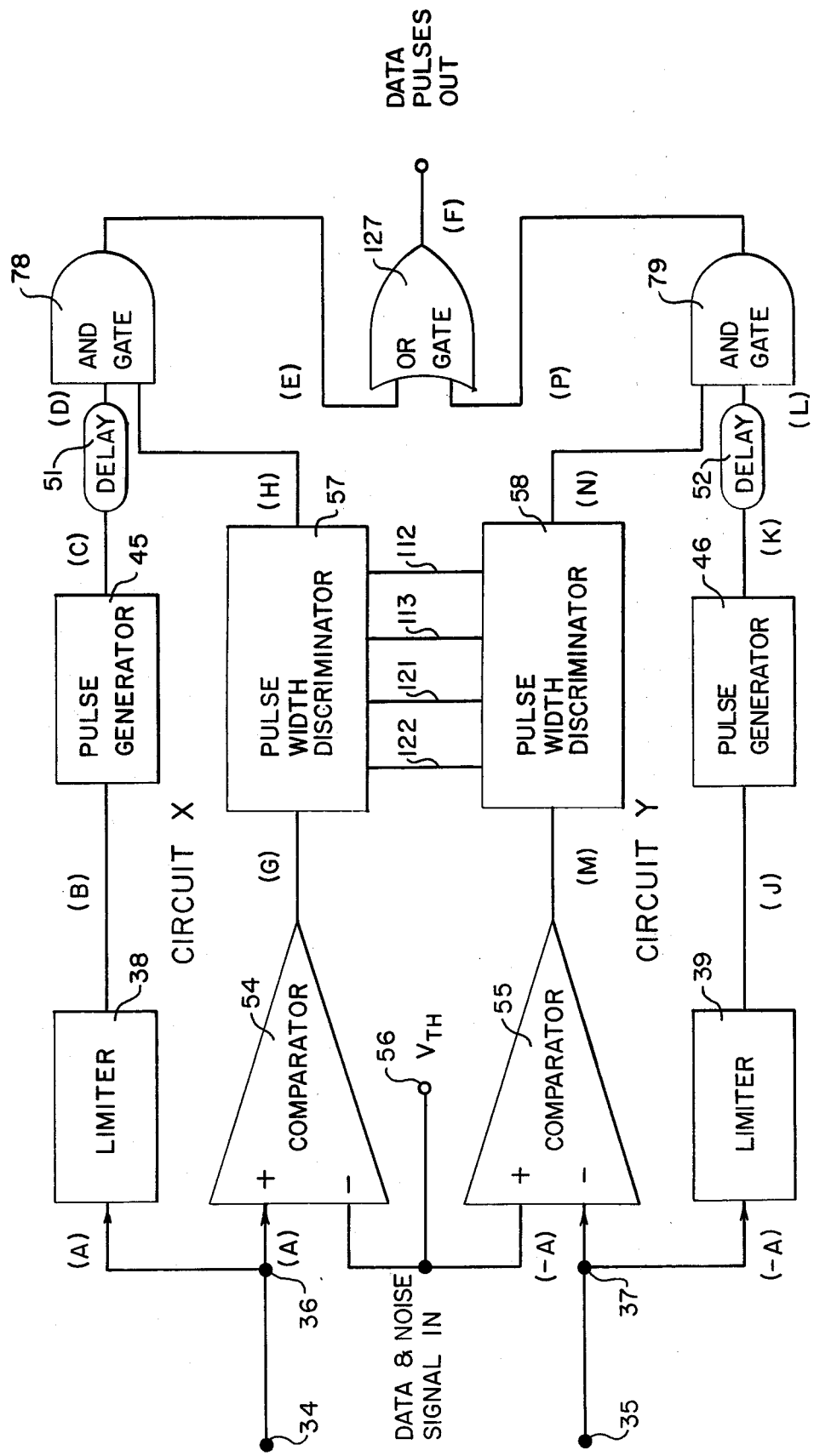
FIG. 2 shows the circuit of the present invention in block diagram form.

FIG. 3 represents the waveforms generated in the circuit of FIG. 2 and will be referred to concurrently with the description of FIG. 2. The data signals A and -A are received by the circuits of FIG. 2 at the terminals 34 and 35 respectively and are fed through the junctures 36 and 37 to the circuits X and Y. Thus the signal A is fed through circuit X while a signal −A (not shown) is supplied to circuit Y. Circuits X and Y are substantially identical with the exception that one circuit acts on the inversion of the signal of the other circuit to detect the negative going data crossover points. Thus circuit X detects zero crossover points for the positive slope signal portions and circuit Y detects the zero crossover points for the negative slope areas of the data signal.

Each of the circuits X and Y include first and second circuits which are identical. The waveforms generated in those circuits are shown in FIG. 3 identified by the letters A through H, J through N and P. In the first circuit of circuit X, a limiter 38 is used to generate the signal B by amplification of the signal significantly near the crossover points for generation of the square wave signal. Similarly a limiter 39 generates the square wave signal J. If the noise pulses 29 and 30 and the white noise pulses 31 did not exist in the data signal A the signals B and J would follow the waveforms 40 and 41 respectively. However with the presence of the noise pulses, the signals actually follow the waveforms 42 and 44 thereby blanking out the reduction in signal magnitude occurring between the data peaks 46B and 46A.

It is the noise pulses 29, 30, 31 and 47 shown in FIG. 3 which must be deleted from the data signals A and −A before the zero crossing points can be effectively detected. The pulses 29 and 30 are representative of noise caused by defects in the medium in which the data is recorded. The pulse 47 is an extraneous pulse in the data stream. The multitude of pulses in the noise signal 31 is indicative of white noise due to electronic thermal noise and media wide band noise. In addition there may be additional noise due to interference or spurious signals generated in the electrical circuits for detecting the data signal. These pulses shown are indicative of noise encountered in such data recording systems making the accurate detection of the zero crossover points and of the data difficult.

The signal B and the signal J are fed to the pulse generator 45 and the pulse generator 46 respectively, for the generation of the first pulse signals C and K. As illustrated in FIG. 3, the pulse generators generate the constant width pulses 48A and 48 originating on the occurrence of the forward or leading edge of the squared data and noise signal. Obviously the pulses 49 and 50 would not occur except for the occurrence of the noise signals shown as a series of pulses 29, 30 and 47 and the wide and apparently constant or elongated white noise pulse illustrated as the noise 31. The signals C and K are thereafter fed to the delay circuits 51 and 52 respectively, which circuits serve to synchronize the outputs of the first circuits with that of the second circuits being fed to the AND gaes 78 and 79, respectively. The necessity for synchronizing the signals will be pointed out with the explanation of the second circuits following.

The signal A and the signal −A are fed to the second circuits of the circuits X and Y which include the comparators 54 and 55, respectively. An additional input signal to these comparators is the threshold signal $V_{TH}$ supplied to the terminal 56. The purpose of this threshold signal is to delete all pulses having a lesser magnitude but as pointed out before, if this threshold voltage is set at a high enough magnitude to effectively delete all the noise, it may also detele data pulses from the data signal. Thus in the present circuit the threshold voltage is set sufficiently low to limit very substantially the possibility of any data pulses being deleted.

Signal G from the comparator 54 is thereafter fed to the pulse width discriminator 57 which deletes those pulses having a pulse width less than a predetermined value, which value is set so as to limit any exclusion of data pulses but to exclude most if not all noise pulses not previously deleted in the comparator to generate a second pulse signal. As pointed out before, experience has shown that in the instance of computer data systems, the present data pulses have a pulse width approximately 100 nanoseconds while the noise pulses usually are no more than 50 nanoseconds in width. Thus in the example shown, the pulse width discriminators are set to only transmit pulses having a width greater than 70 nanoseconds. The specific operation of these pulse width discriminators will be described with respect to FIG. 4. The signal M from the comparator 55 likewise is fed to the pulse width discriminator 58.

Figure 4:
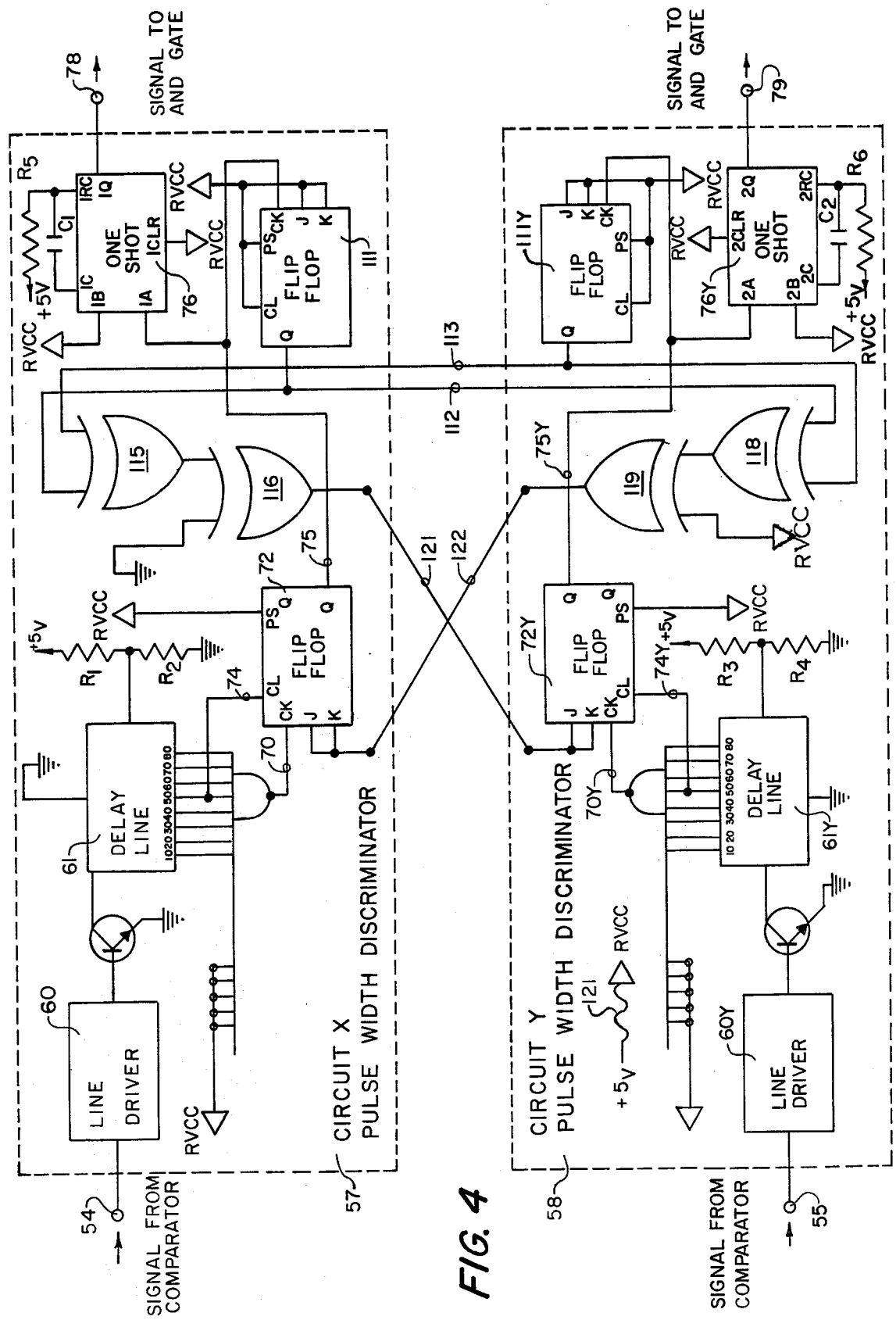
FIG. 4 is a circuit diagram of the pulse width discriminators of FIG. 2.

The pulse width discriminators 57 and 58 shown in FIG. 4 function to transmit a third pulse signal comprising only those pulses having a width or time period greater than 70 nanoseconds at the voltage level of $V_{TH}$ (DC). In addition these discriminators are connected in a toggle switch manner such that they are permitted only to transmit pulses alternately. It is known that in a standard data signal without noise, a zero crossing point having a positive slope must be followed by a zero crossing point of the data signal having a negative slope. However with the occurrence of noise, frequently the slope of the signal will change without the interim occurrence of a zero crossover point or in the alternative, a zero crossover will occur without detection. Thus by alternately transmitting zero crossover points of opposite slopes, such areas of slope change caused by noise will be detected and deleted.

Shown in FIG. 4 are the circuits for the pulse width discriminators 57 and 58. To describe the operation of the discriminator 57 that portion of the signal of FIG. 3 including the data pulses 46B and 46A and the noise pulses 29, 30 and 47 of FIG. 3 are shown to represent the input data signal G. Keep in mind that much of the white noise 31 has been deleted by the action of the comparators 54 and 55. This input signal is fed through a separate circuit including a line driver 60 to a delay line 61 having 10 nanosecond interval taps. As the pulse travels down this delay line, the line is interrogated every 10 nanoseconds and if all the taps remain high when the eighth tap becomes high or after 80 nanoseconds total, this indicates that the pulse width is at least 70 nanoseconds. The signals of the taps are shown as pulses 62 through 69 of FIG. 5. Of course the subsequent signals will not occur if the pulses are not at least 70 nanoseconds in width and to illustrate this fact, the positive going pulse 46B illustrates a data pulse having a width greater than 70 nanoseconds and the positive going noise pulse 29 has a width less than 70 nanoseconds for illustration. Thus the resulting waveforms 62 through 69 result such that there is transmitted through the conductor 70 a signal pulse 71 causing the flip-flop circuit 72 to transmit a pulse. The circuit 72 has been previously set by receipt of a pulse through the conductor 74 when the fifth or 50 nanosecond tap went high such that on receiving the pulse 71 through conductor 70 the circuit is caused to transmit through the conductor 75 a pulse 74A having a width proportional to the input pulse width. The pulse 74 is fed to the pulse generator 76 for the generation of a uniform duration pulse 77 representing signal H which is supplied to the AND gate 78 (FIG. 2).

Figure 5:
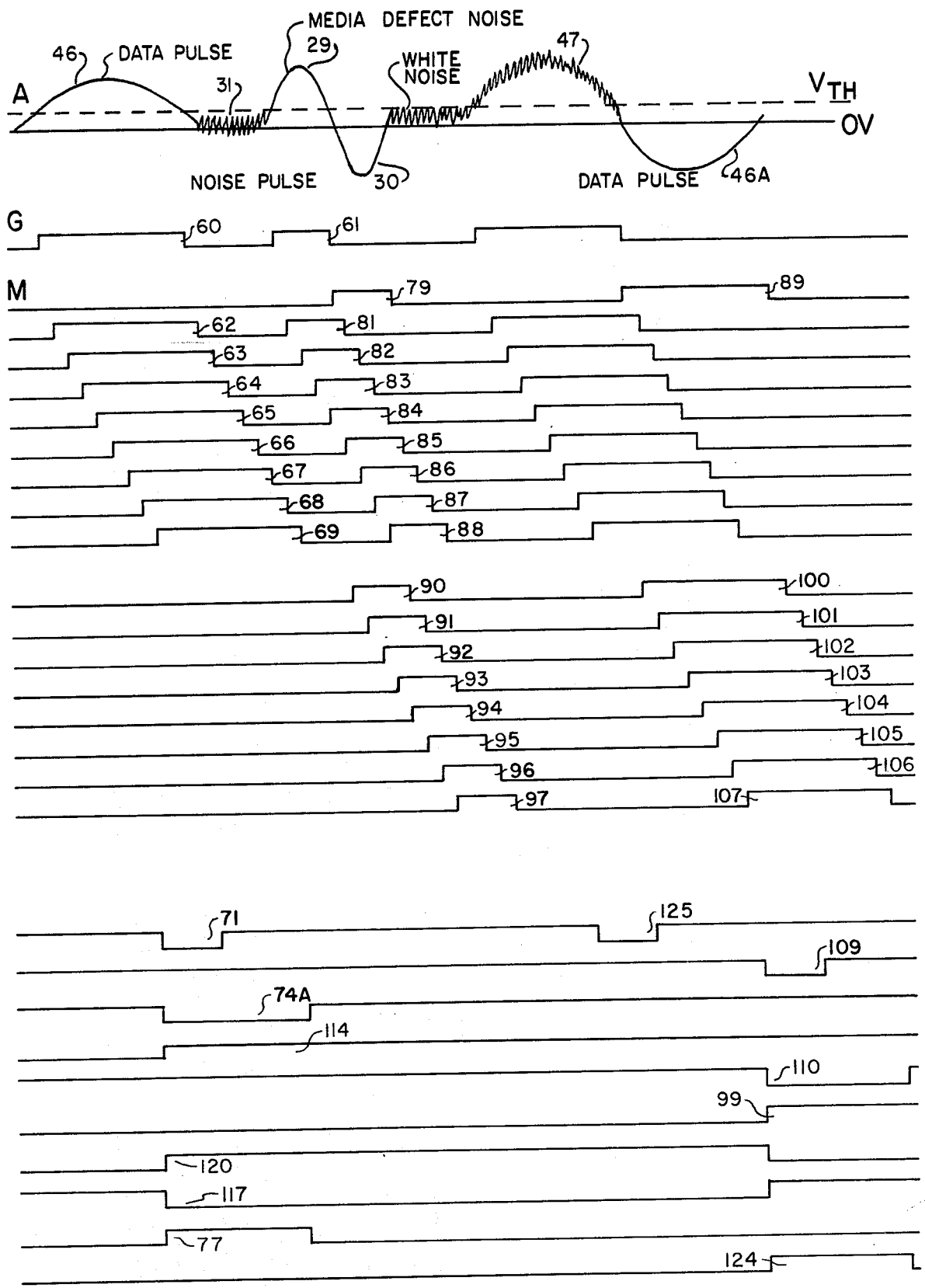
FIG. 5 shows various signals generated in the circuit of FIG. 4.

To illustrate how the discriminator 57 blocks a pulse having a width less than 70 nanoseconds, when the noise pulse 29 having a width of approximately 20 nanoseconds is transmitted to the delay line 61 there will result at the delay line taps the signals 81 through 88 (FIG. 5). However the flip-flop circuit 72 will only transmit a pulse if the data pulse 29 has a greater width than 70 nanoseconds. As can be seen in FIG. 5 the waveform 81 representing the first 10 nanosecond tap is no longer high when the noise pulse reaches the tap 8 representing the 80 nanosecond period indicated by the signal 88. Thus no signal will be transmitted through the conductor 70 even though a signal to set the flip-flop circuit to condut has been received through the conductor 74. In this manner, any signal having a width less than 70 nanoseconds does not cause a resulting pulse to be transmitted.

The operation of the pulse width discriminator 58 is identical to that of the discriminator 57 with the waveforms identified by the numerals 90 through 97 and 100 through 107 and the similar components having the suffix Y. Because the signal −A received by this second separate circuit is the inverted signal A, the threshold voltage levels and the positive pulses detected are in reality the negative and the negative going pulses. The following description assumes that the signal M received includes as a result the noise pulse 30 and the data pulse 46A representing the negative noise and data of the signal A. Thus with the noise pulse 30 being received, no pulse is transmitted through the circuit 72Y because the pulse is less than 70 nanoseconds in length. However with receipt of the negative going data pulse 46A, the circuit 72Y is set and the pulse 109 results to cause generation of the constant width pulse 110 by the circuit 76Y at the terminal for the AND gate 79 in the same manner as described with respect to the operation of the pulse width discriminator 57. As a result a pulse 110 is generated with the advent of each input data pulse having a pulse width greater than 70 nanoseconds and is represented as signal N for the −A portion of the data signal.

Similarly with the transmittal of the noise pulse 30 to the pulse width discriminator 58, there will result at the delay line taps for the delay line 61Y the pulses 90 through 97. As can be seen, since the pulse width is approximately 20 nanoseconds, there will be no signal transmitted through the conductor 70Y. However with the transmittal of the following negative data pulse 46A which is greater than 70 nanoseconds in width, there will result the pulses 100 through 107 at the various taps of the delay line which will result in the transmittal through conductor 70Y of the pulse 109. The pulse 109 will trigger the circuit 76Y to transmit the pulse 110 to the AND gate 79.

Thus as described, there is provided a circuit for eliminating noise from a data signal by transmitting only those pulses having an amplitude greater than a predetermined magnitude and a pulse width greater than a preselected time period at a predetermined amplitude level. By proper selection of the magnitude and time period most or all of the noise will be eliminated. Of course the greater the difference between the characteristics of magnitude and pulse width of the data and the noise pulses, the more effective the previously described system will be.

With the use of the first and second circuits in each discriminator 57 and 58 and utilization of the pulses generated in the second circuit to gate the transmission of pulses occurring in the first circuit, a better zero crossing to zero crossing time relationship is maintained in the original signals A and −A and the resulting signals E and P. By the use of this system, the possibility that the time delays in the second circuit components will vary with frequency or some other variable and will effect signal synchronization is minimized. The components utilized in the first circuits of the detector 20, namely the limiter and pulse generator, have known frequency versus time delay characteristics whereas other components of the second circuit necessary to carry out the function of noise detection may have less predictable time delay versus frequency characteristics.

To further assure the elimination of noise from the data signal, there is added another function in the subject zero crossover detector, namely the toggle effect between the pulse width discriminators of the circuits X and Y. By this effect, a pulse indicating a zero crossover point of one pulse width discriminator must always be preceded and followed by a corresponding pulse of the other pulse width discriminator. It has been recognized that a negative going data zero crossing must of necessity be followed by a positive going data zero crossing. Thus the subject circuit utilizes this principle to further assure that the zero crossings are a result of data crossings only.

The toggle effect of the pulse width discriminators 57 and 58 assures that the discriminators will alternately transmit pulses. To generate the toggle effect, there is utilized the circuits 111 and 111Y which receive the pulses 74A and 109 generated by the circuits 72 and 72Y through the conductors 75 and 75Y, respectively. It is the purpose of these circuits to alternately permit the circuits 72 and 72Y to transmit pulses. Thus with the transmittal of the first pulse 74A through the conductor 75, the circuit 111 will be set to transmit through the conductor 112 the pulse 114 in FIG. 5. As a result, the Exclusive/OR circuits 115 and 116 will transmit the signal 117 while the Exclusive/OR circuits 118 and 119 of the discriminator 58 will transmit the pulse 120. The reason the Exclusive/OR circuits 116 and 119 must be high alternately is because the circuit 119 compares the incoming signal to the reference voltage RVCC which in the instance shown is a 5 volt source with a current limiting resistor 121 (FIG. 4), while 116 compares it to GND potential.

As a result of the signals from the circuits 116 and 119 the circuit 72Y will be set for transmittal of a zero crossing indicating pulse while the circuit 72 will be shut off. With the subsequent transmittal of a pulse through the conductor 75Y of the pulse discriminator 58, the same toggle switch action will result in the setting of the circuit 72 for conducting the next pulse received while the circuit 72Y will be disabled. Thus it can be seen that the transmittal of a pulse by discriminator 57 will thereafter set discriminator 58 for the transmittal of the next pulse while preventing the sequential conduction through the same circuit and vice-versa. In this manner the toggle action is provided through the conductors 121 and 122 of FIGS. 2 and 4.

The following are typical values of other components of the circuit of FIG. 4:

| R₁ | 91 ohms | R₅ | 5.1 Kiloohms |

| | -continued | | |
|---|---|---|---|
| $R_2$ | 110 ohms | $R_6$ | 5.1 Kiloohms |
| $R_3$ | 91 ohms | $C_1$ | 30 Pico farads |
| $R_4$ | 110 ohms | $C_2$ | 30 Pico farads |

As a result of the toggle action a pulse 71 from the delay line 61 which is greater than 70 nanoseconds in width will be conducted as a pulse 74A (FIG. 5) because of the enabling of the flip-flop 72. This pulse is subsequently transmitted to the AND gate 78 as pulse 77. At the same time, the flip-flop 72 is disabled and the flip-flop 72Y enabled by the signals 120 and 117 from the Exclusive/OR circuits 116 and 119. As a result a subsequent pulse 109 is transmitted as pulse 124 to the AND gate 79 in the same manner. However subsequent to the pulse 71, a following pulse 125 resulting from a noise pulse 47 is not transmitted because of the setting of the flip-flops 72 and 72Y which otherwise would indicate an erroneous zero crossing point 27. Thus it can be seen that only consecutive zero crossing pulses of positive and negative going data pulses are detected and intervening noise pulses are eliminated.

Turning now to FIG. 3, the data pulses of the signals C and K are transmitted through the delay circuits 51 and 52 respectively to time these pulses with those signals H and N of the pulse width discriminators 57 and 58. These pulses 47 and 48 thus are delayed and result in the pulses 47A and 48A of signals D and L. In the same manner the noise generated pulses 49 and 50 are delayed and result as pulses 49A and 50A. The signals D and H are joined in the AND gate 78 while the signals N and L are joined in the AND gate 79. When pulses of these joined signals occur simultaneously, i.e. pulses 77A and 47A and pulses 48A and 124A, the circuit transmits the resulting pulses 125 and 126 respectively.

The transmission of the pulses 125 and 126 results from the transmission of the pulses 77A and 124A corresponding in prefix to the generation of the pulses 77 and 124 described previously with respect to the circuit of FIG. 4 and the signals shown in FIG. 5. These pulses result from the data pulses 45B and 45A, 46B and 46A of FIG. 3. Such pulses 77A and 124A meet the test of having a magnitude greater than the threshold voltage $V_{TH}$ and a pulse width greater than 70 nanoseconds at the $V_{TH}$ level. Noise pulses 29 and 30 are subsequently deleted because of these tests. The noise pulse 47 is deleted by the toggle action of the pulse width discriminators 57 and 58. As pointed out before, the white noise pulses 31 were deleted by the comparators eliminating pulses having a magnitude less than the threshold voltage $V_{TH}$. The resulting pulses 125 and 126 are joined as one signal in the OR gate 127 as alternate pulses 125A and 126A of signal F indicating the actual data zero crossing points of the data signal A.

The invention claimed:

1. A circuit for detecting the zero crossover point for data in a data modulated signal subject to noise and wherein the data has an amplitude and pulse width of a predetermined minimum magnitude and positive going and negative going modulations, said circuit comprising, in combination:
   circuit means for generating an inverted signal by inverting the data modulated signal;
   a first circuit including means for generating a first signal having pulses responsive to each zero crossover point of the data modulated signal;
   a second circuit including means for receiving and deleting the noise from said data modulated signal and for generating a second signal having pulses responsive to each zero crossover point of the positive going modulations of the data modulated signal with noise deleted;
   a third circuit including means for receiving and deleting the noise from said inverted signal and for generating a third signal having pulses responsive to all zero crossover points of the positive going modulations of the inverted signal with noise deleted; and
   fourth circuit means for receiving said first, second and third signals and for generating an output signal having pulses responsive to the concurrent occurrence of pulses in the first signal and the second and third signals by comparing the pulses of the second and third signals in alternating sequence with the pulses of said first signal and transmitting pulses in the output signal only when there are concurrent pulses in the first and second signals alternately with the concurrent occurrence of pulses in the first and third signals.

2. A circuit as defined in claim 1 wherein said second and third circuits include means for deleting all pulses having a pulse width less than a preselected magnitude, said preselected width magnitude being set at a value less than the predetermined minimum magnitude of the pulse width of said data in the data modulated signal.

3. A circuit as defined in claim 2 wherein said second and third circuits include means for deleting all pulses having an amplitude less than a preselected magnitude, said preselected magnitude being set at a value less than the predetermined minimum magnitude of the amplitude of the data in the data modulated signal.

4. A circuit for detecting the zero crossover points of a data modulated signal subject to noise modulations also and wherein the data pulses in the modulated signal have a minimum predetermined width and magnitude, said circuit comprising, in combination:
   first and second pulse generators for generating first pulse signals having pulses corresponding to all modulations of the modulated signal received;
   first and second comparators for generating a second pulse signal having pulses responsive to all modulations greater than a predetermined magnitude of the modulated signal received, said second pulse signal pulses having a width corresponding to the width of the modulations of said modulated signal received;
   first and second pulse width discriminators each generating a third pulse signal respectively having a pulse corresponding to each pulse of said second pulse signal which has a width greater than the predetermined minimum pulse width;
   first circuit means for supplying to said first pulse generator and said first comparator said data modulated signal and for supplying said second pulse signal from the first comparator to said first pulse width discriminator;
   second circuit means for supplying to said second pulse generator and said second comparator the data modulated signal in inverted form and for supplying said second pulse signal from the second comparator to said second pulse width discriminator; and
   third circuit means to receive said first pulse signal from the first pulse generator and said third pulse signal from the first pulse width discriminator and said first pulse signal from the second pulse generator and said third pulse signal from the second pulse width discriminator in alternating sequence and to transmit said first pulse signals of the first and second pulse generators alternately when said each first pulse signal occurs simultaneously with said third pulse signal with which it is compared.

* * * * *